(12) United States Patent
Hasegawa et al.

(10) Patent No.: US 8,062,028 B2
(45) Date of Patent: Nov. 22, 2011

(54) HEAT TREATMENT APPARATUS FOR OXIDE SUPERCONDUCTING WIRE

(75) Inventors: Takayo Hasegawa, Tokyo (JP); Tsutomu Koizumi, Tokyo (JP)

(73) Assignee: International Superconductivity Technology Center, The Jurdical Foundation, Tokyo (JP)

( * ) Notice: Subject to any disclaimer, the term of this patent is extended or adjusted under 35 U.S.C. 154(b) by 744 days.

(21) Appl. No.: 12/087,311

(22) PCT Filed: Jan. 10, 2007

(86) PCT No.: PCT/JP2007/050138
§ 371 (c)(1),
(2), (4) Date: Jul. 1, 2008

(87) PCT Pub. No.: WO2007/080875
PCT Pub. Date: Jul. 19, 2007

(65) Prior Publication Data
US 2010/0282244 A1 Nov. 11, 2010

(30) Foreign Application Priority Data

Jan. 13, 2006 (JP) ................. 2006-005830

(51) Int. Cl.
*A21B 1/22* (2006.01)
(52) U.S. Cl. .......................................... 432/59; 219/406
(58) Field of Classification Search ................ 432/8, 59, 432/31, 60, 88, 225; 219/636, 391, 406, 219/407; 505/230, 430
See application file for complete search history.

(56) References Cited

U.S. PATENT DOCUMENTS

| 1,916,372 | A  | * | 7/1933  | Hepburn et al. | ........... 242/364.2 |
| 5,719,106 | A  | * | 2/1998  | Mukai et al.   | .................. 505/430 |
| 6,303,908 | B1 | * | 10/2001 | Yamaga et al.  | ................ 219/411 |
| 6,632,776 | B2 | * | 10/2003 | Kobayashi et al. | ........... 505/470 |
| 7,179,416 | B2 | * | 2/2007  | Ueno           | ............................ 266/104 |

FOREIGN PATENT DOCUMENTS

| JP | 63-29184    | 2/1988  |
| JP | 04-329867   | 11/1992 |
| JP | 2003-121076 | 4/2003  |
| JP | 2004-171841 | 6/2004  |

* cited by examiner

*Primary Examiner* — Gregory A Wilson
(74) *Attorney, Agent, or Firm* — Bacon & Thomas, PLLC

(57) ABSTRACT

This invention provides a heat treatment apparatus for an oxide superconducting wire that is easy to control atmosphere during baking and can realize a high manufacturing speed. A heat treatment apparatus (1) comprises a heat treating furnace (4) and a cylindrical rotator (5), rotatable about a horizontal rotating axis, provided within the heat treating furnace (4). The rotator (5) in its cylindrical body (5a) have a number of through-holes (5b) formed evenly over the whole surface of the cylindrical body (5a). One end of the cylindrical body (5a) is hermetically sealed by a lid. On the other end, a gas discharge pipe (7) for discharging gas within the cylindrical body to the outside of the heat treating furnace (4) is connected to the lid. A plurality of gas supply pipes (8) are symmetrically provided separately from each other on the outer surface of the cylindrical body (5a). A number of gas jet holes are formed in each of the gas supply pipe (8) so as to jet atmosphere gas toward the surface of the cylindrical body. A tape-shaped wire (6) formed of a precursor film of a YBCO superconducting layer is wound around the rotator (5) for heat treatment for superconductor formation.

8 Claims, 3 Drawing Sheets

HEAT TREATMENT APPARATUS FOR OXIDE SUPERCONDUCTING WIRE

TECHNICAL FIELD

This invention relates to a heat treatment apparatus. In particular, this invention relates to the heat treatment apparatus for oxide superconducting wire which is applicable to a production for a tape-shaped rare earth-containing oxide superconducting wire which is appropriate to a use for electric power devices such as a superconducting electric power cable or a superconducting electric power storage and a use for power equipment such as a motor.

BACKGROUND ART

Among the oxide superconducting wire, $YBa_2Cu_3O_{7-x}$ (YBCO) superconducting wire has the structure that a biaxially-oriented thin film of one layer or plural layers comprising the inorganic material is formed onto the metallic substrate, and that the superconducting film and the stabilized layer are formed in sequence onto the biaxially-oriented thin film of the inorganic material. Because this wire has the biaxially-oriented crystal, the critical current (Ic) value is higher than the bismuth type silver sheathed wire, and the magnetic-field property is superior in the liquid nitrogen temperature. Therefore, by using this wire, it is expected that the superconducting equipment which is used in the low temperature at present can be used in the high temperature state.

The characteristic of this YBCO superconductor is affected strongly by the orientation of that crystal. Therefore, the characteristic of this YBCO superconductor is affected strongly by this substrate which constitutes the lower layer and by the orientation of the crystal of the intermediate layer.

That is, a crystal system of the YBCO superconductor is an orthorhombic crystal. Therefore, in order to bring out the characteristic of the material in conducting property, it is required that not only a CuO face of the crystal but also an in-plane crystal orientation is aligned. The reason is that because a little mismatch of the orientation generates grain boundaries of the twin crystal, the conducting property deteriorates.

Various methods are studied now for the film formation of the YBCO superconducting wire. IBAD (Ion Beam Assisted Deposition) method or RABiTS (Trade Mark: Rolling Assisted Biaxially Textured Substrate) method is known as the manufacturing technology of the biaxially-oriented metal substrate that the in-plane oriented intermediate layer is formed onto the tape-shaped metal substrate. And many YBCO superconducting wires are reported. These YBCO superconducting wires have the intermediate layer whose in-plane orientation degree and orientation are improved, and the intermediate layer is formed onto non-oriented or oriented metal tape. For example, the following rare earth-containing tape-shaped oxide superconductor is known. As the substrate, that rare earth type tape-shaped oxide superconductor uses the substrate which consists of Ni or Ni based alloy having oriented texture by heat treatment after strong rolling process. And the oxide intermediate layer of the thin film of Ni oxide, $CeO_2$ and so on which is formed by MOD method and the YBCO superconducting layer are formed in sequence onto the surface of this substrate. (for example, refer to Patent document No. 1).

Among the background arts, the method using IBAD substrate has the highest characteristic. The superconducting wire by this method is formed by using following steps. Onto the tape-shaped Ni based substrate (hastelloy and so on) having nonmagnetism and high strength, the intermediate layer ($CeO_2$, $Y_2O_3$, YSZ and so on) or the intermediate layer having two layer structure (YSZ or $Gd_2Zr_3O_7/CeO_2$ or $Y_2O_3$ and so on) is formed by depositing the particles generated from the target using laser evaporation during irradiation of ion from the diagonal direction for this Ni based substrate. These intermediate layers have high orientation and inhibits the reaction with the elements which constitute the superconductor. And after forming the $CeO_2$ film onto that layer by PLD method, the YBCO layer is formed by PLD method (for example, refer to Patent document No. 2).

However, in this method, because all layers are formed by vacuum process of gas phase method, there is advantage that the dense and smooth intermediate layer film can be obtained. But there are problems that the film formation speed is slow, the equipment cost becomes high and the wire cost rises. Although some film formation methods have been studied other than this IBAD method, the available methods for solving about the problems of the cost and the formation speed have not been reported.

Chemical vapor deposition method (CVD) has the problem that although manufacturing speed is fast than other vapor phase methods, it is difficult to increase the film thickness for obtaining high Ic value. The most effective method to actualize the low cost is MOD method (Metal Organic Deposition Processes) which forms the oxide layer by using the metal organic acid salt or the organic metallic compound as the raw material, and by giving the heat treatment after coating the raw material.

Because this process does not use the vacuum process, there are advantages that the equipment cost and the maintenance cost are low. Therefore, it is expected that this process provides the low cost superconductor. In this case, if the film of the intermediate layer also can be formed by MOD process, it is possible to decrease the cost furthermore.

The important point in the film formation process of the YBCO superconducting layer by this MOD process is the atmosphere control at the time of baking. Especially, it is that the baking process is established so that the uniform gas flow can be sprayed on the surface of the calcination film.

Heretofore, for the purpose of forming the stable atmosphere in the axial direction of the tubular furnace, the atmosphere control type furnace for heat treatment which has the following structures is known. That is, the tube of furnace-core is double structure. And two pairs of gas-supplying-channels and gas-discharging-channels are formed by arranging the four partition boards between the outer tube and the inner tube. Besides, the plural gas-outflow-holes in gas-supplying-channels and the plural gas-inflow-holes in gas-discharging-channels are arranged (for example, refer to Patent document No. 3).

Patent document No. 1: Japanese Patent Publication No. 2004-171841
Patent document No. 2: Japanese Patent Publication No. Hei04-329867
Patent document No. 3; Japanese Patent Publication No. 2003-121076

DISCLOSURE OF THE INVENTION

Problem to be Solved by the Invention

As described above, heretofore, the mechanism for sending out the wire from the reel and the mechanism for rewinding the wire to the reel are arranged at both ends of the tunnel furnace, and the process (reel-to-reel) for baking the wire which moves in the furnace at constant speed has been investigated. However, because of the tunnel furnace process, there are disadvantages that the control of atmosphere in the furnace is difficult and the manufacturing speed is slow.

This invention was conducted to solve the above disadvantages. And this invention aims to provide the heat treatment apparatus for oxide superconducting wire which is easy to control the atmosphere at the time of baking by spraying the uniform gas flow on the surface of the calcination film and which has high manufacturing speed.

In the case that the film formation process is conducted in the batch type electric furnace, this invention aims to provide the heat treatment apparatus that gas supply and gas discharge become appropriate by flowing the atmosphere gas sufficiently in the furnace and long wire can be baked at a time.

Means for Solving the Problems

The heat treatment apparatus for oxide superconducting wire of this invention is equipped with a heat treating furnace and a cylindrical rotator which is rotatably arranged about a horizontal rotating axis for winding the wire to be heat-treated in the inside of the heat treating furnace. The above described rotator is equipped with a cylindrical body that a large number of through-holes are formed. And the rotator is equipped with a lid for sealing one end of this cylindrical body. Besides, the rotator is equipped with a lid that a gas discharge pipe is connected at other end for discharging a gas of inside of the above described cylindrical body to outside of above described heat treating furnace. Furthermore, the rotator is equipped with plural gas supply pipes which are arranged distantly from an outer surface of the above described cylindrical body and are symmetrically arranged about the above described rotating axis and that a large number of gas ejection holes are formed. Additionally, the rotator is equipped with a connection pipe which is connected to the above described gas supply pipes for supplying the atmosphere gas to the above described gas supply pipes from the outside of the above described heat treating furnace.

In the above described case, it is preferable that a large number of gas jet holes are formed on each gas supply pipe so as to jet the atmosphere gas toward the surface of the cylindrical body.

EFFECT OF THE INVENTION

According to this invention, the atmosphere gas is sprayed onto the surface of the calcination film which is the wire to be heat-treated as the uniform gas stream from a large number of gas ejection holes which are formed in the two or more gas supply pipes which are arranged distantly from the outer surface of the cylindrical body and are symmetrically arranged about the axis of the rotation. And this gas is discharged to the outside of the heat treating furnace from a large number of through-holes which are formed in the cylindrical body. Therefore, the atmosphere control of the surface of the calcination film becomes easy and the oxide superconducting wire can be manufactured by making manufacturing speed fast. Besides, the furnace of this invention has the advantage that the structure is simple.

BEST MODE FOR CARRYING OUT THE INVENTION

Figure 3:
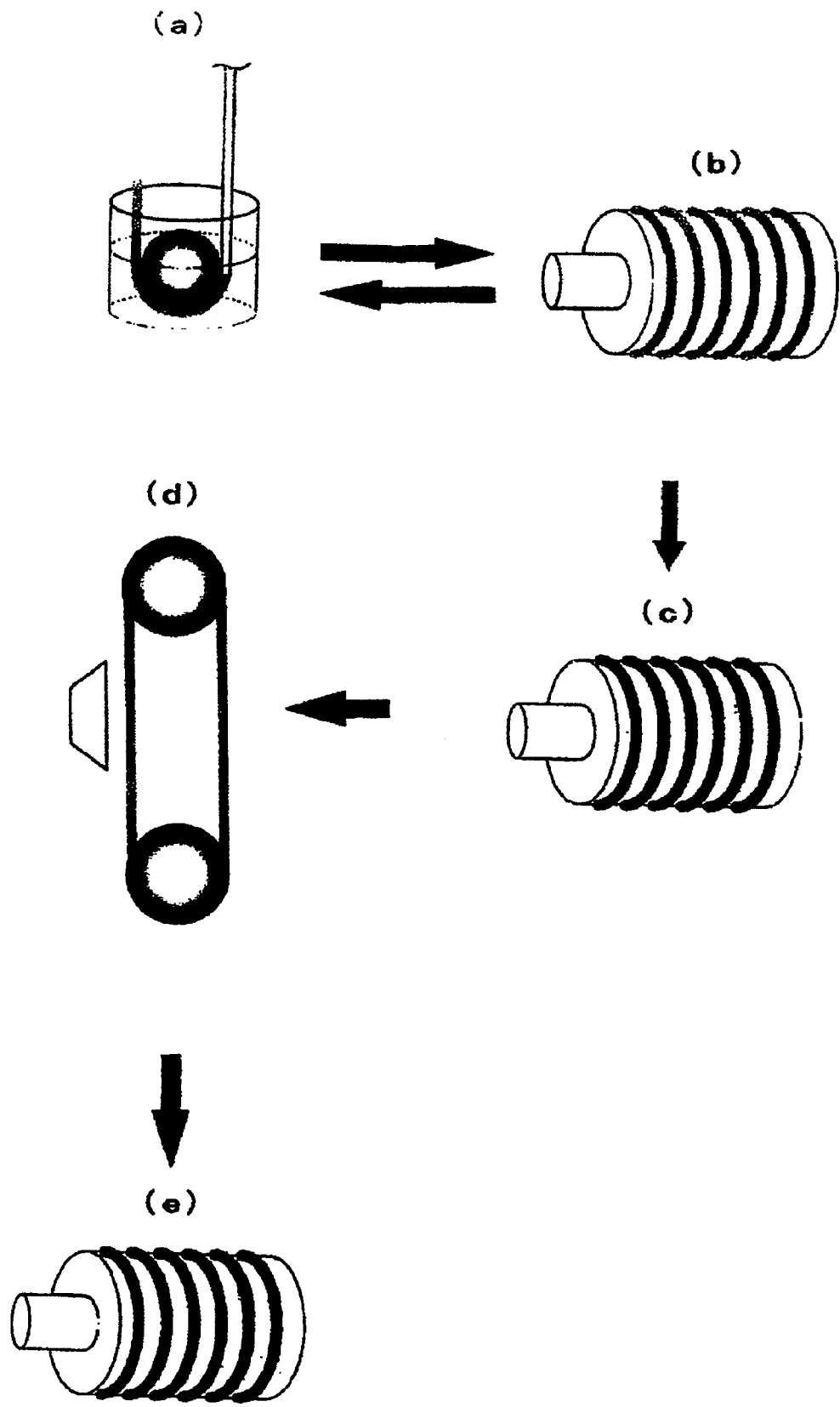
[FIG. 3] The outline drawing which shows the manufacturing process of the YBCO superconducting wire by MOD method.

FIG. 3 shows the outline of the manufacturing process of the YBCO superconducting wire by MOD method. The intermediate layer film of $Gd_2Zr_2O_7$ is formed by IBAD method as the template onto the Ni based substrate having the biaxial-orientation. Furthermore, onto the composite substrate that $CeO_2$ intermediate layer film is formed by PLD method onto this $Gd_2Zr_2O_7$ film, (a) the mixed solution which dissolved Y-trifluoroacetate, Ba-trifluoroacetate and Cu-naphthenate into the organic solvent at the ratio of Y:Ba:Cu=1:2:3 is coated by the dip coat method, and then, (b) these are calcinated, and the coating process and the calcinating process are repeated with the predefined times, after that, (c) the crystallization heat treatment, that is, the heat treatment for forming of the YBCO superconductor is given, in the next step, (d) the Ag stabilized layer is formed by sputtering, and (e) the YBCO superconducting wire is manufactured by giving postheat treatment.

Although the heat treatment apparatus of this invention is used to the crystallization heat treatment of the above described (c), it is applicable also to the forming of the above described intermediate layer.

Although the above described Ni based substrate has the biaxial-orientation, it is also possible to use the biaxial-oriented intermediate layer film which is formed onto the metal substrate having no orientation. And the intermediate layer is formed with one layer or two or more layers. As the coating method, although it is also possible to use the ink-jet method, the spray method and so on in addition to the above described dip coat method, basically, it is not restrained by this example if it is the process which can coat the mixed solution onto the composite substrate continuously. The film thickness which is coated at one time is 0.01 μm-2.0 μm, and preferably is 0.1 μm-1.0 μm.

The MOD raw material which is used here is the metal organic acid salt or the organic metallic compound including Y, Ba and Cu with predefined molar ratio. The number of moles is Y:Ba:Cu=1:(2+a):(3+b). And a is 0.01<a<0.3, b is 0.01<b<0.05. In the case of the number of moles other than this range, there are the problems that the superconducting layer is not formed or that much impurities are generated. Besides, as the metal organic acid salt, the octylic acid salt, naphthenate, neo decanoic-acid salt and trifluoroacetate of each component are given. And if the metal organic acid salt dissolves uniformly in the organic solvent of one kind or two kinds or more and if it is possible to coat onto the composite substrate, these metal organic acid salt can be used.

Hereinafter, the embodiment of this invention is explained.

Embodiment

Figure 1:
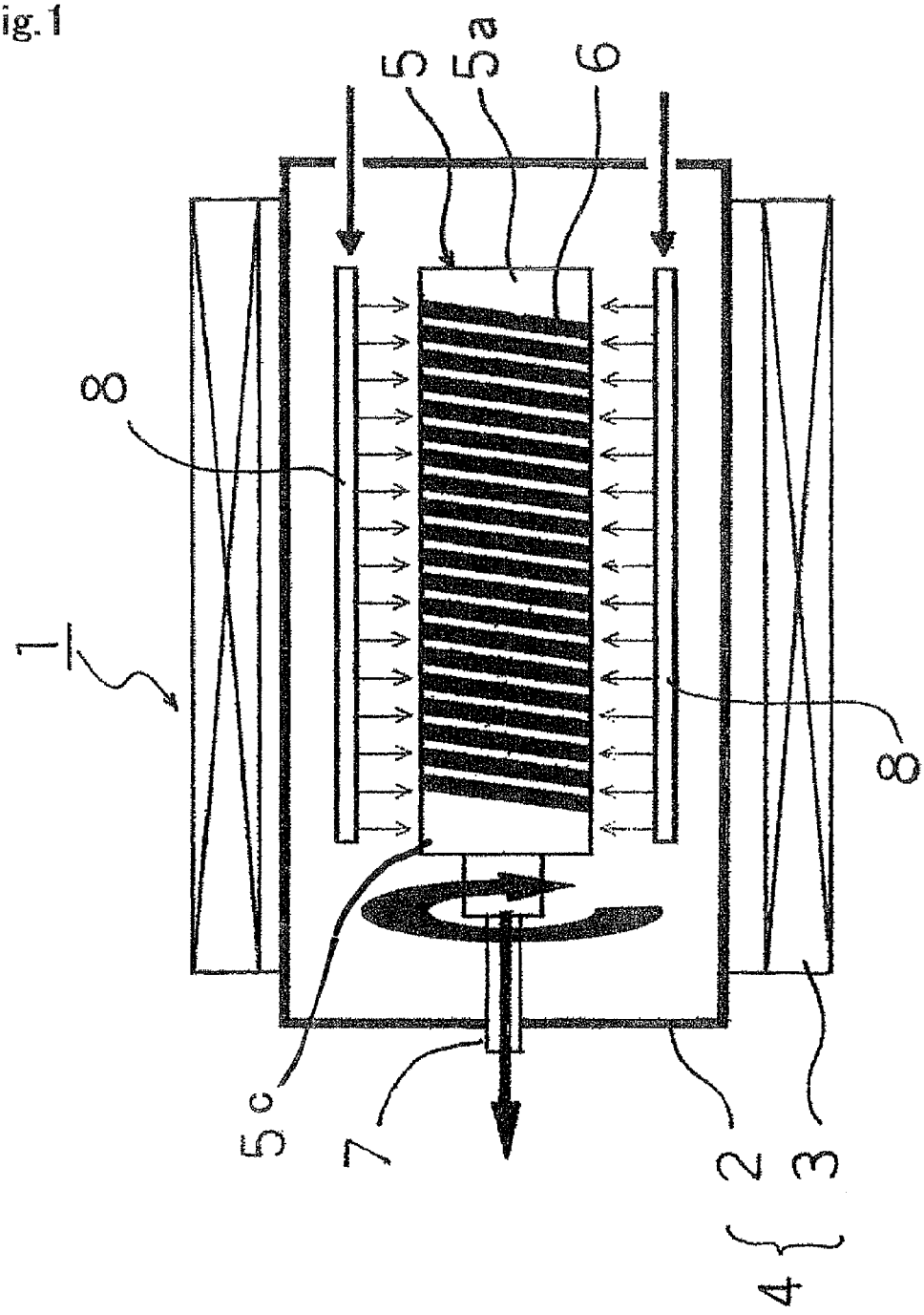
[FIG. 1] The outline cross-section drawing which shows an embodiment of the structure concerning the heat treatment apparatus for oxide superconducting wire of this invention.
Figure 2:
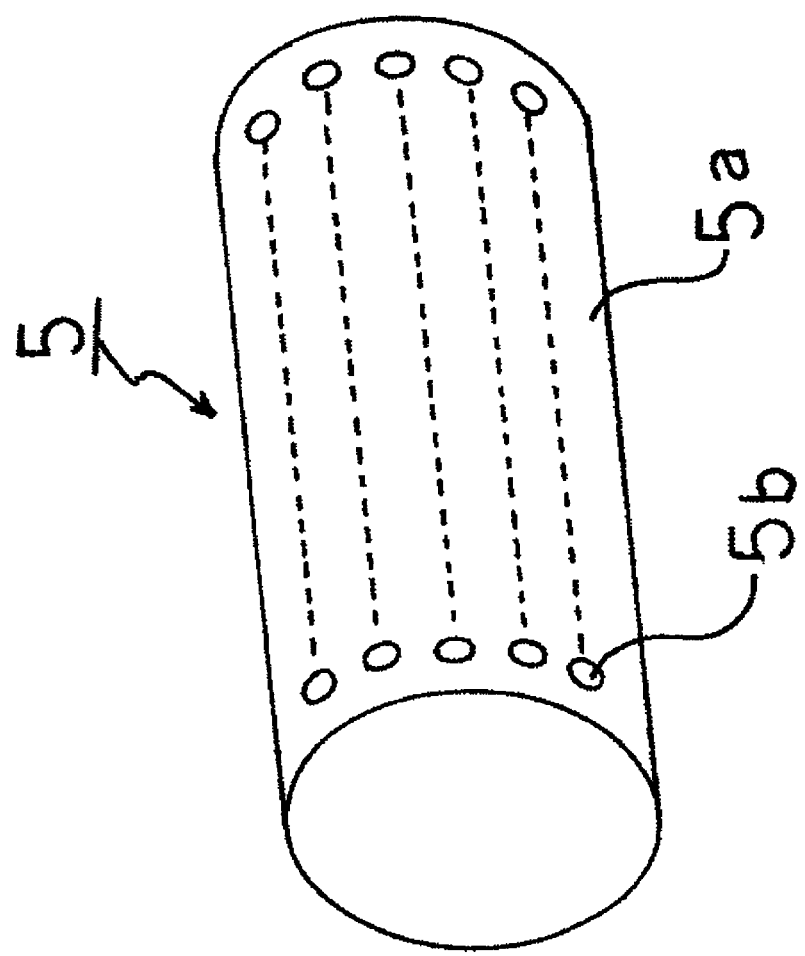
[FIG. 2] The outline drawing of an embodiment of the cylindrical rotator which is used in this invention.

Hereinafter, the composition of this invention is explained using FIG. 1 and FIG. 2. FIG. 1 is an outline cross-section drawing which shows an embodiment of the structure of the heat treatment apparatus for oxide superconducting wire of this invention and FIG. 2 shows the cylindrical rotator which is arranged in that apparatus. This rotator is formed by a material which resists to high temperature and does not oxidize, such as silica glass, ceramics, hastelloy or inconel alloy and so on.

The heat treatment apparatus 1 is equipped with the heat treating furnace 4 which is comprised of the furnace body 2 and the electric heater 3 which is arranged in the outside of this furnace body 2. And the heat treatment apparatus 1 is equipped with the cylindrical rotator 5 which is arranged in the inside of the heat treating furnace 4. This cylindrical rotator 5 is rotatably arranged about horizontal rotating axis in the inside of this heat treating furnace 4. And the intermediate layer having the biaxial-orientation is formed onto the substrate to be heat-treated as the composite substrate. And then, the precursor film of the Y based (123) superconducting layer is formed onto the composite substrate as the tape-shaped wire 6, and the tape-shaped wire 6 is wound around the circumference of this cylindrical rotator 5. After that, the heat treatment for producing the superconductor is given.

In the cylindrical body 5a of the rotator 5, a large number of through-holes 5b which have the diameter of ½ or less of the width of the tape-shaped wire 6 are formed evenly over the whole surface of the cylindrical body 5a. One end of the cylindrical body 5a is sealed by a lid. And at the other end, a gas discharge pipe 7 for discharging the inside gas of the cylindrical body to the outside of the heat treating furnace 4 is connected to the lid.

Besides, plural (at least four) gas supply pipes 8 are arranged distantly from the outer surface of the cylindrical body 5a and are arranged symmetrically about the rotating axis of the rotator 5. A large number of gas jet holes (not shown in drawing) are formed in each of the gas supply pipe 8 so as to jet atmosphere gas toward the surface of the cylindrical body. It is preferable that the length of the gas supply pipe 8 is longer than the height of the cylindrical body 5a. The diameter of the gas jet hole is necessary to be designed so that the gas pressure and the gas flow become uniform. The gas supply pipes 8 is formed from the material which resists to high temperature and does not oxidize, such as silica glass, ceramics, hastelloy or inconel alloy and so on.

The atmosphere gas is supplied to the gas supply pipes 8 through the connection pipe (not shown in drawing) which is connected to the gas supply pipes 8 from the atmosphere gas supply apparatus (not shown in drawing) which is arranged at the outside of the heat treating furnace.

The above described heat treatment apparatus 1 is composed so that the inside of the heat treating furnace is able to maintain the reduced-pressure atmosphere. Besides, the above described atmosphere gas supply apparatus is connected to the gas supply system for supplying inert gas, oxygen gas and water vapor. And the atmosphere gas supply apparatus is equipped with the mechanism in which these atmosphere gases can be changed according to the pattern of heat treatment.

In the above described heat treatment apparatus 1, the cylindrical rotator 5 that the tape-shaped wire is wound is rotated with predefined rotating speed by driving mechanism (not shown in drawing). Therewith, the atmosphere gas is jetted towards the surface of the rotator from a large number of gas jet holes of the gas supply pipes 8 in the inside of the heat treating furnace 4 with maintaining heated atmosphere by the electric heater 3. Meanwhile, this atmosphere gas is inhaled into the inside of the cylindrical body 5a from a large number of through-holes 5b of the cylindrical body 5a and discharged to the outside of the heat treatment furnace 4 through the gas discharge pipe 7 which is connected to the other end of the cylindrical body 5a.

Hereinafter, the illustrative embodiment of this invention is explained.

The intermediate layer film of $Gd_2Zr_2O_7$ was formed by IBAD method as the template onto the Ni based substrate having the biaxial-orientation. Furthermore, onto the composite substrate that $CeO_2$ intermediate layer film was formed by PLD method onto this $Gd_2Zr_2O_7$ film, the mixed solution which dissolved Y-trifluoroacetate, Ba-trifluoroacetate and Cu-naphthenate into the organic solvent at the ratio of Y:Ba:Cu=1:2:3 was coated by the dip coat method. And then, these were calcinated on condition of maximum temperature of 450 degrees C. and water vapor partial pressure of 5%, and the coating process and the calcinating process were repeated with the predefined times. After that, by using above described heat treatment apparatus, the heat treatment was given in the atmosphere of 750 degrees C. and water vapor partial pressure of 13%, and the YBCO superconducting layer was formed. In the next step, the Ag stabilized layer was formed by sputtering onto the YBCO superconducting layer, and the YBCO superconducting wire having Jc of $1 MA/cm^2$ or more was manufactured.

INDUSTRIAL APPLICABILITY

The heat treatment apparatus for oxide superconducting wire of this invention can apply to the rare earth-containing tape-shaped oxide superconductor which is applicable to the cable, the electric power equipment and the power equipment.

The invention claimed is:

1. A heat treatment apparatus for oxide superconducting wire, equipped with a heat treating furnace and a cylindrical rotator which is rotatably arranged about a horizontal rotating axis in an inside of this heat treating furnace for winding the wire to be heat-treated, wherein:

said rotator is equipped with a cylindrical body which has a large number of through-holes, a lid for sealing one end of this cylindrical body, and a lid connecting with a gas discharge pipe for discharging a gas of inside of said cylindrical body to be outside of said heat treating furnace at other end, said rotator is equipped with plural gas supply pipes which are arranged distantly from an outer surface of said cylindrical body and are arranged symmetrically about said rotating axis and has a large number of gas ejection holes, and said rotator is equipped with a connection pipe which is connected to said gas supply pipes for supplying an atmosphere gas to said gas supply pipes from the outside of said heat treating furnace.

2. The heat treatment apparatus for oxide superconducting wire according to claim 1, wherein
a large number of gas ejection holes are formed on each gas supply pipe so as to jet the atmosphere gas toward the surface of the cylindrical body.

3. The heat treatment apparatus for oxide superconducting wire according to claim 1, wherein
the wire to be heat-treated is a calcinated tape-shaped wire after coating a mixed solution which dissolved a metal organic acid salt or an organic metallic compound including metal elements which constitute a Y based (123) superconducting layer onto a composite substrate that an intermediate layer is formed by one or more inorganic material filmy layers which have a biaxial-orientation onto a substrate into an organic solvent.

4. The heat treatment apparatus for oxide superconducting wire according to claim 3, wherein
the metal organic acid salt including metal elements in the mixed solution consists of any one of octylic acid salt, naphthenate, neodecanoic acid salt or trifluoroacetate.

5. The heat treatment apparatus for oxide superconducting wire according to claim 3, wherein
a diameter of each through-hole which are formed on the cylindrical body is ½ or less of the width of the tape-shaped wire.

6. The heat treatment apparatus for oxide superconducting wire according to claim 1, wherein
the wire to be heat-treated is a calcinated tape-shaped wire after coating the mixed solution which dissolved the metal organic acid salt or the organic metallic compound including metal elements which constitute the intermediate layer onto the substrate into the organic solvent.

7. The heat treatment apparatus for oxide superconducting wire according to claim 6, wherein
the metal organic acid salt including metal elements in the mixed solution consists of any one of octylic acid salt, naphthenate, neodecanoic acid salt or trifluoroacetate.

8. The heat treatment apparatus for oxide superconducting wire according to claim 6, wherein
a diameter of each through-hole which are formed on the cylindrical body is ½ or less of the width of the tape-shaped wire.

* * * * *

UNITED STATES PATENT AND TRADEMARK OFFICE
CERTIFICATE OF CORRECTION

PATENT NO. : 8,062,028 B2  
APPLICATION NO. : 12/087311  
DATED : November 22, 2011  
INVENTOR(S) : Takayo Hasegawa et al.

Page 1 of 1

It is certified that error appears in the above-identified patent and that said Letters Patent is hereby corrected as shown below:

The correct Item (73) on the face page as follows:

(73) Assignee: International Superconductivity Technology Center, The Juridical Foundation, Tokyo (JP) and --SWCC-- Showa Cable Systems., Ltd. Tokyo (JP)

Signed and Sealed this
Twenty-seventh Day of March, 2012

David J. Kappos
*Director of the United States Patent and Trademark Office*

UNITED STATES PATENT AND TRADEMARK OFFICE
CERTIFICATE OF CORRECTION

PATENT NO. : 8,062,028 B2  
APPLICATION NO. : 12/087311  
DATED : November 22, 2011  
INVENTOR(S) : Takayo Hasegawa et al.

Page 1 of 1

It is certified that error appears in the above-identified patent and that said Letters Patent is hereby corrected as shown below:

The correct Item (73) on the face page as follows:

(73) Assignee: International Superconductivity Technology Center, The Juridical Foundation, Tokyo (JP) and SWCC Showa Cable Systems Co. Ltd. Tokyo (JP)

This certificate supersedes the Certificate of Correction issued March 27, 2012.

Signed and Sealed this
Thirtieth Day of October, 2012

David J. Kappos
*Director of the United States Patent and Trademark Office*